(12) United States Patent
Ming-Hui et al.

(10) Patent No.: US 6,849,801 B2
(45) Date of Patent: Feb. 1, 2005

(54) ELECTRONIC CARD

(75) Inventors: Tung Ming-Hui, Taipei Hsien (TW); Lin Ching-Chun, Chung-Ho (TW); Jeff Wang, Taipei Hsien (TW)

(73) Assignee: Wise Power Tech Co., Ltd., Taoyuan (TW)

( * ) Notice: Subject to any disclaimer, the term of this patent is extended or adjusted under 35 U.S.C. 154(b) by 0 days.

(21) Appl. No.: 10/434,237

(22) Filed: May 9, 2003

(65) Prior Publication Data

US 2004/0222005 A1 Nov. 11, 2004

(51) Int. Cl.$^7$ .................................................. H05K 5/00
(52) U.S. Cl. ...................... 174/52.1; 361/736; 361/737
(58) Field of Search ....................... 174/52.1, 50, 35 R, 174/35 EC; 361/728, 736, 737, 748, 752, 816, 818; 439/76.1, 945, 946

(56) References Cited

U.S. PATENT DOCUMENTS

| | | | | |
|---|---|---|---|---|
| 5,107,073 A | * | 4/1992 | Steffen | 174/52.1 |
| 5,476,387 A | * | 12/1995 | Ramey et al. | 439/76.1 |
| 5,481,434 A | * | 1/1996 | Banakis et al. | 361/756 |
| 5,497,297 A | * | 3/1996 | Kilmer et al. | 361/737 |
| 5,596,486 A | * | 1/1997 | Young et al. | 361/737 |
| 5,833,473 A | * | 11/1998 | Betker et al. | 439/76.1 |
| 6,546,621 B2 | * | 4/2003 | Wang | 29/841 |

* cited by examiner

Primary Examiner—Dean A. Reichard
Assistant Examiner—Carmelo Oliva
(74) Attorney, Agent, or Firm—Troxell Law Office PLLC

(57) ABSTRACT

An electronic card of the present invention has an insulative casing, a connector, a circuit board, a receiving portion, a first shell and a second shell. The insulative casing includes a first bar, a second bar and a transverse bar between the first bar and the second bar. The first shell and the second shell are assembled to shield the insulative casing therebetween. The first shell forms tabs respectively for locking with assembling passages of the first bar and the second bar and locking holes of the transverse bar. The receiving portion has a first cover and a second cover, and either of the first cover and the second cover is unitarily formed with the insulative casing. A transverse bar connects with the first bar and the second bar and forms a lib thereon. Such an electronic card is assembled conveniently and reliably, and shield from EMI.

20 Claims, 7 Drawing Sheets

( Section 7-7 )

( Section 9-9 )

ELECTRONIC CARD

BACKGROUND OF THE INVENTION

1. Field of the Invention

The present invention relates to an electronic card, particularly to a improved electronic card which is assembled conveniently and reliably and shields against EMI, furthermore avoiding shortcut between a metallic shell and a connector thereof.

2. Related Art

A conventional electronic card comprises an insulative casing accommodating a circuit board therein, a connector assembled to a side of the insulative casing and electrically connecting with the circuit board for communication, and a first shell and a second shell respectively shielding the circuit board against Electromagnetic Interference (EMI).

However, the first and the second shells of the conventional electronic card are packaged to the insulative casing by heat or glue, as shown in U.S. Pat. No. 5,107,073. The first shell and the second shell tend to release from each other when the electronic card is in use. Such an electronic card is integrated unfirmly.

The connector of the electronic card has a metallic shielding strip for shielding from EMI near the connector. The metallic shielding strip envelops a side of the connector and forms a plurality of pins for communicating with the circuit board thereby shielding from EMI.

However, the metallic shielding strip is exposed between the first and the second shells, the shortcutting between the metallic shielding strip and the first and second shells may occur when the electronic card is in use, resulting in error in transmission.

Additionally, shielding from EMI is subject to gaps between the insulative casing and the first and the second shells, tending to unreliable transmission of signals.

SUMMARY OF THE INVENTION

Accordingly, an object of the present invention is to provide an electronic card which is assembled easily and firmly, shield from EMI reliably, and avoids shortcutting.

To achieve the above-mentioned object, an electronic card in accordance with the present invention comprises an insulative casing, a first shell and a second shell enclosing the insulative casing. The insulative casing includes a first bar, a second bard and a transverse bar between the first bar and the second bar and transversely connecting with an end of the first bar and an end of the second bar. Assembling passages are respectively defined in opposite ends of the first bar and the second bar and are far from the transverse bar. Positioning passages are defined in the first bar and the second bar and are opposite to the assembling passages. Falling surfaces are respectively formed on outward side of the first bar and the second bar. Obstruction passages are defined in the first bar and the second bar and adjacent to the transverse bar and the falling surfaces. At least a locking hole is defined in the transverse bar.

The first shell has tabs for cooperating with the assembling passages of the first bar and the second bar and the locking hole of the transverse bar to receive a card, and a pair of mounting walls for embracing the falling surfaces of the first bar and the second bar. The first shell is assembled to the first bar, the second bar and the transverse bar via the locking wall and the mounting walls.

The second shell has a latching wall for cooperating with the positioning passages of the first bar and the second bar, enveloping walls for embracing the mounting walls of the first shell, and obstruction walls for abutting against the obstruction passages of the first bar and the second bar. The second shell is assembled firmly to the first bar, the second bar and the transverse bar via the latching walls and the obstruction walls.

A first cover and a second cover forms a receiving portion adjacent to the transverse bar. Either of the first cover and the second cover is integrally formed with the insulative casing.

Other objects, advantages and novel features of the present invention will be drawn from the following detailed embodiments of the present invention with attached drawings, in which:

DESCRIPTION OF THE PREFERRED EMBODIMENTS

Figure 1:
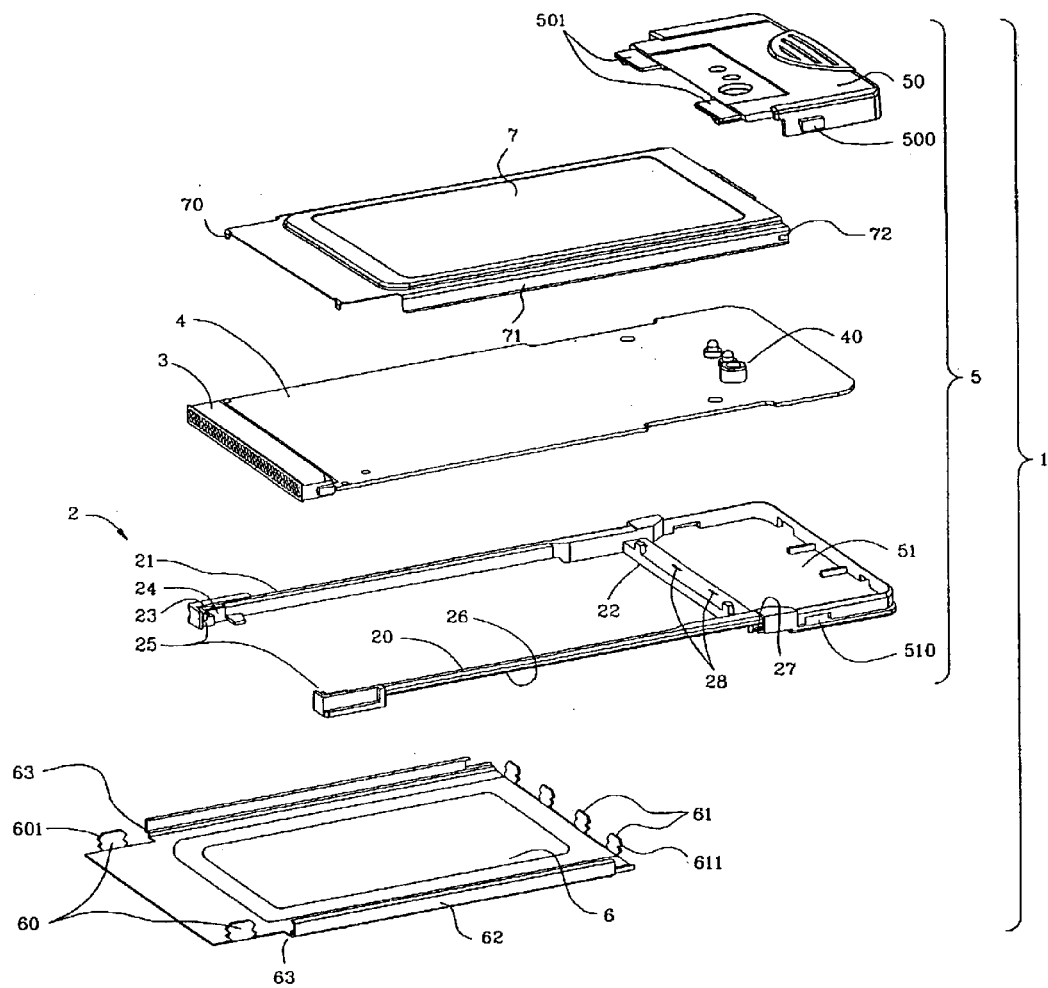
FIG. 1 is an exploded view of an electronic card in accordance with a first embodiment of the present invention.
Figure 2:
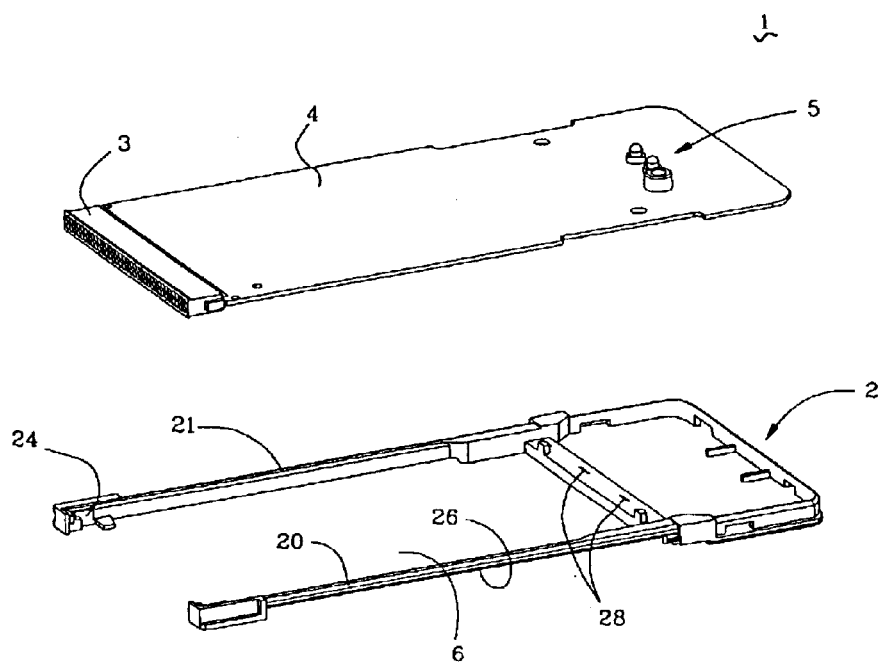
FIGS. 2–4 are a assembled view of the electronic card of FIG. 1.

Referring to FIG. 1, an electronic card 1 of the present invention comprises an insulative casing 2, a connector 3, a circuit board 4, a receiving portion 5, a first shell 6 and a second shell 7.

The insulative casing 2 includes a first bar 20, a second bar 21 and a transverse bar 22 between and the first bar 20 and the second bar 21 and transversely connecting with an end of the first bar 20 and an end of the second bar 21. Assembling passages 23 are respectively defined in opposite ends of the first bar 20 and the second bar 21 and are far from the transverse bar 22. Receiving passages 24 are defined adjacent to the opposite ends of the first bar 20 and the second bar 21 for receiving the connector 3. Positioning passages 25 are defined in the first bar 20 and the second bar 21 and are opposite to the assembling passages 23. Falling surfaces 26 are respectively formed on outward side of the first bar 20 and the second bar 21. Obstruction passages 27 are defined in the first bar 20 and the second bar 21 and adjacent to the transverse bar 22 and the falling surfaces 26. Four locking holes 28 are defined in the transverse bar 22.

The receiving portion 5 includes a first cover 50 and a second cover 51. The second cover 51 extends integrally and longitudinally from the transverse bar 22. Fixing holes 510 are respectively defined in sides of the second cover 51, and locking posts 500 are formed on the first cover 50 for corresponding to the fixing holes 510. The first cover 50 further forms arms 501 for clamping the transverse bar 22 when the first shell 6 and the second shell 7 are assembled together, thereby the locking posts 500 of the first cover 50 easily locking with the fixing holes 510.

The first shell 6 shields a surface of the insulative casing 2 in assembly. A plurality of first tabs 60 extend perpendicularly from edges of opposite sides of the first shell 6, and first interference portions 601 extend from opposite side edges of each first tab 60 for facilitating the retention of the first tabs 60 and assembling passages 23 of the first bar 20 and the second bar 21. A plurality of second tabs 61 extend perpendicularly from an edge of the first shell 6, and second interference portions 611 extend from opposite side edges of each second tab 61 for facilitating the retention of the second tabs 61 and locking holes 28 of the first bar 20 and the second bar 21. Mounting walls 62 bend and extend from opposite sides of the first shell 6 for enveloping outward surfaces of the first bar 20 and the second bar 21. A biasing surface 63 is provided adjacent to each mounting wall 62 for abutting against the second shell 7 when the first shell 6 and the second shell 7 are assembled together.

The second shell 7 shields an surface of the insulative casing 2 opposite the first shell 6 in assembly. Latching walls 70 perpendicularly extend from edges of opposite sides of the second shell 7 and have an inverted-cone shape for cooperating with the positioning passages 25 of the first bar 20 and the second bar 21. Enveloping walls 71 extend from the second shell 7 for embracing the mounting walls 62 of the first shell 6. Obstruction walls 72 are provided on the enveloping walls 71 for abutting against the obstruction passages 27 of the first bar 20 and the second bar 21. The circuit board 4 is received in the insulative casing 2 and electrically connects with the connector 3. A wireless appliance 40 communicates with the circuit board 4 and is received in the receiving portion 5.

Figure 3:
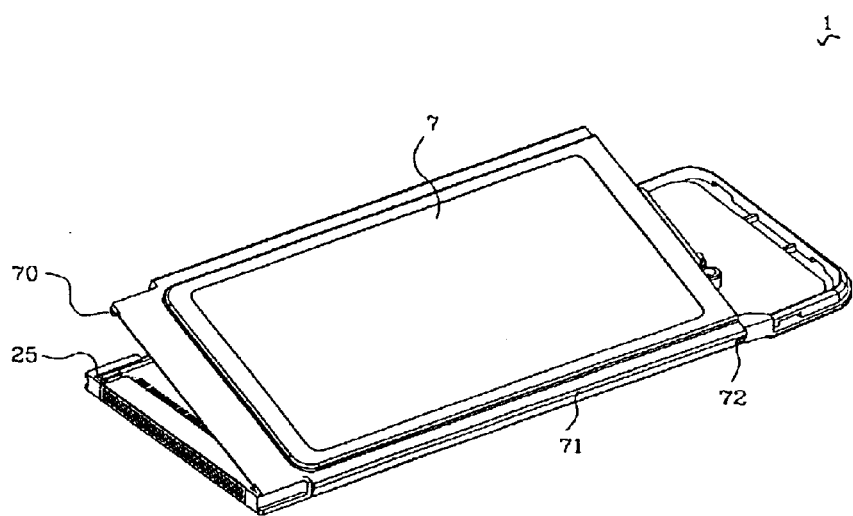
Figure 4:
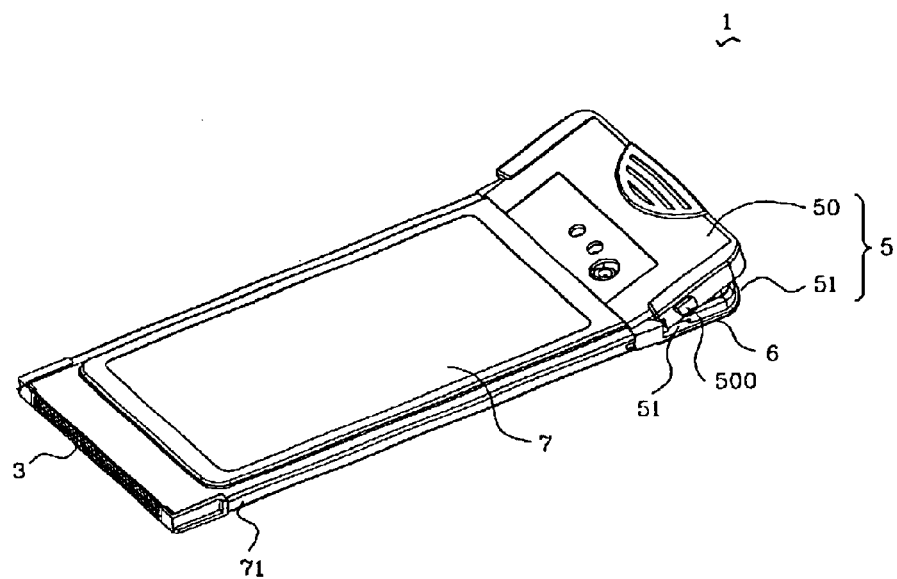
Figure 5:
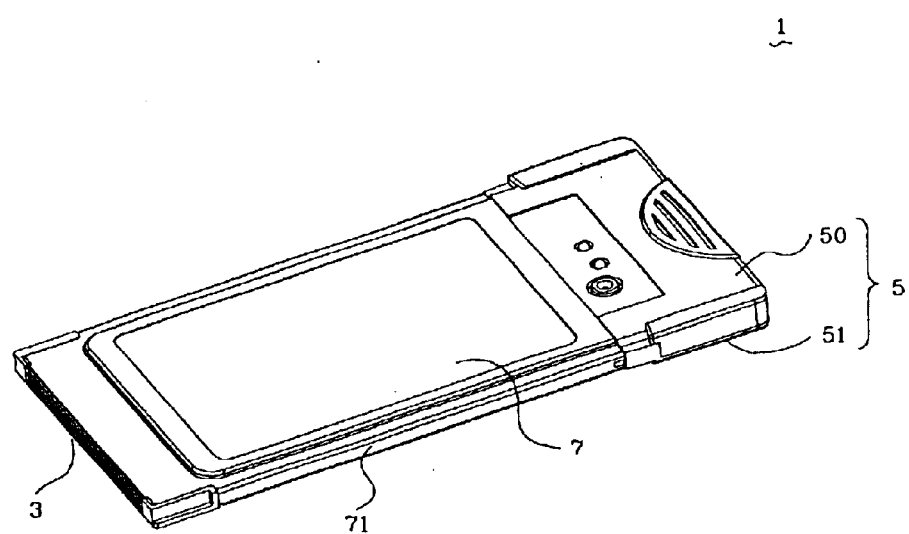
FIG. 5 is a perspective view of the electronic card of FIG. 1.
Figure 6:
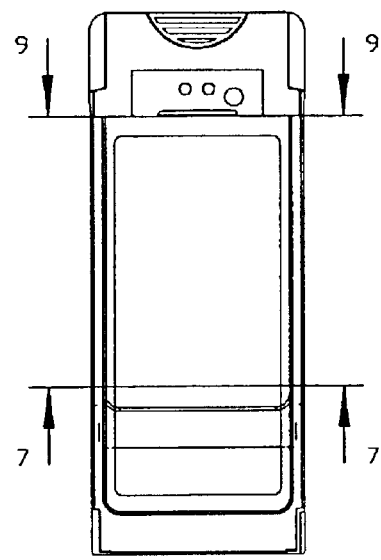
FIG. 6 is a top view of the electronic card of FIG. 1.
Figure 7:
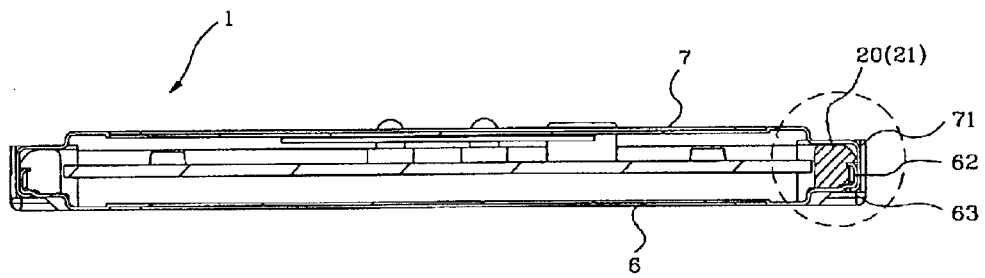
FIG. 7 is cross-sectional view taken from the line 7—7 of FIG. 6.
Figure 8:
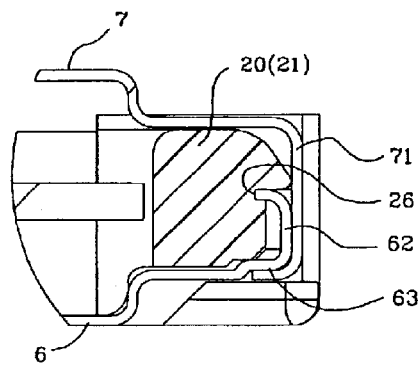
FIG. 8 is an partially enlarged view of FIG. 7.
Figure 9:
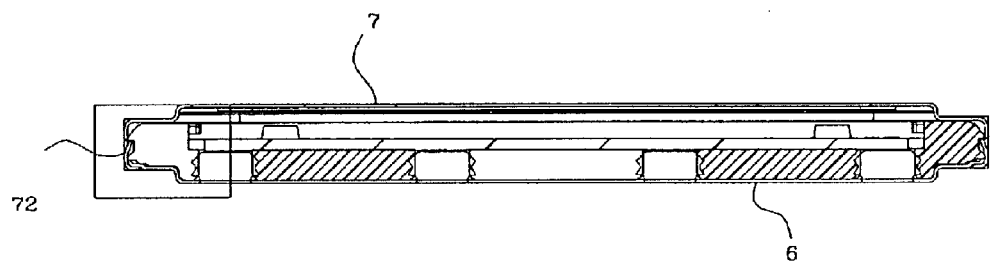
FIG. 9 is an cross-sectional and assembled view taken from the line 9—9 of FIG. 6.
Figure 10:
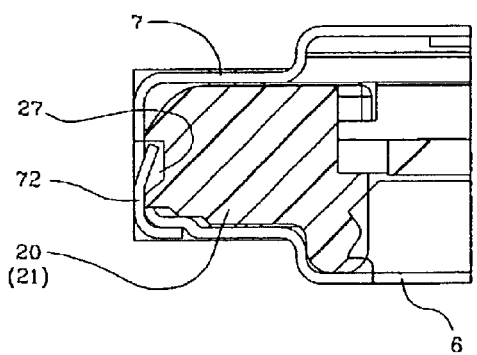
FIG. 10 is a partially enlarged view of FIG. 9.

With reference to the FIGS. 1–4, in assembly, the first shell 6 shield a surface of the first bar 20 and the second bar 21. The first tabs 60 lock with the assembling passages 23 of the first bar 20 and the second bar 21, and the second tabs 61 lock with the locking holes 28. The connector 3 is mounted onto the receiving passages 24. The circuit board and the wireless appliance 40 are both received in the insulative casing 2. Then, as shown in FIG. 3, the latching walls 70 are received in the positioning passages 25 of the first bar 20 and the second bar 21. The enveloping walls 71 respectively enclose the mounting walls 62 of the first shell 6. With reference to FIGS. 7 and 8, the mounting walls 62 of the first shell 6 abut against the falling surfaces 26 of the first bar 20 and the second bar 21. The enveloping walls 71 respectively enclose the mounting walls 62 and abut against the biasing surfaces 63 for ensuring the shielding effect. Further referring to FIGS. 9 and 10, the second shell 7 is assembled to a surface of the first bar 20 and the second bar 21 and is opposite to the first shell 6. The obstruction walls 72 of the second shell 7 abut against the obstruction passages 27 of the first bar 20 and the second bar 21. The obstruction walls 72 are slightly inclined and are stamped from outside to inside, so it is uneasy to open the second shell 7 from outside, resulting in reliable assembly of the second shell 7 on the first bar 20 and the second bar 21. Finally, as shown in FIG. 4, the arms 501 of the first cover 50 clamp the transverse bar 22 between the first shell 6 and the second shell 7, whereby the locking posts 500 of the first cover 50 easily lock with the fixing holes 510 of the second cover 51.

Figure 11:
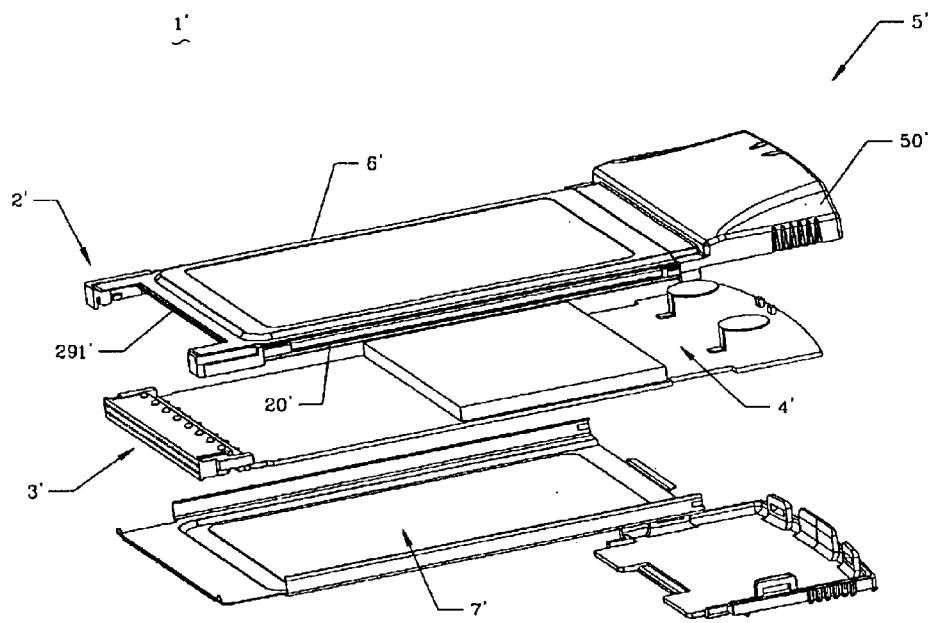
FIG. 11 is an exploded view of the electronic card in accordance with a second embodiment of the present invention.
Figure 12:
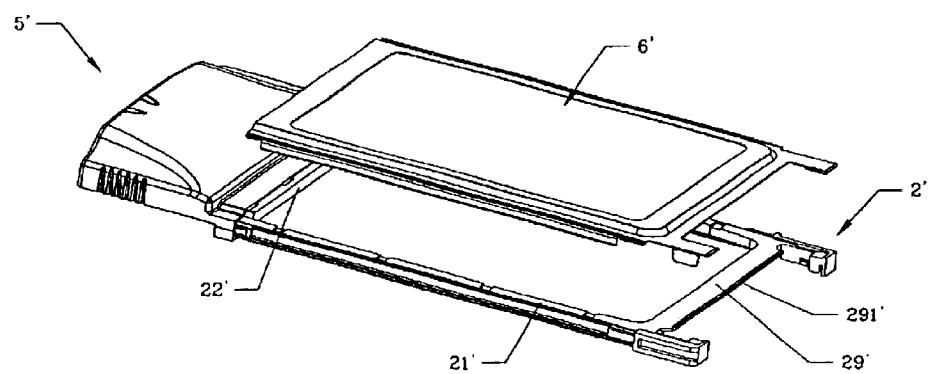
FIG. 12 is an exploded view of a first cover, an insulative casing and shells of the electronic card of FIG. 11.
Figure 13:
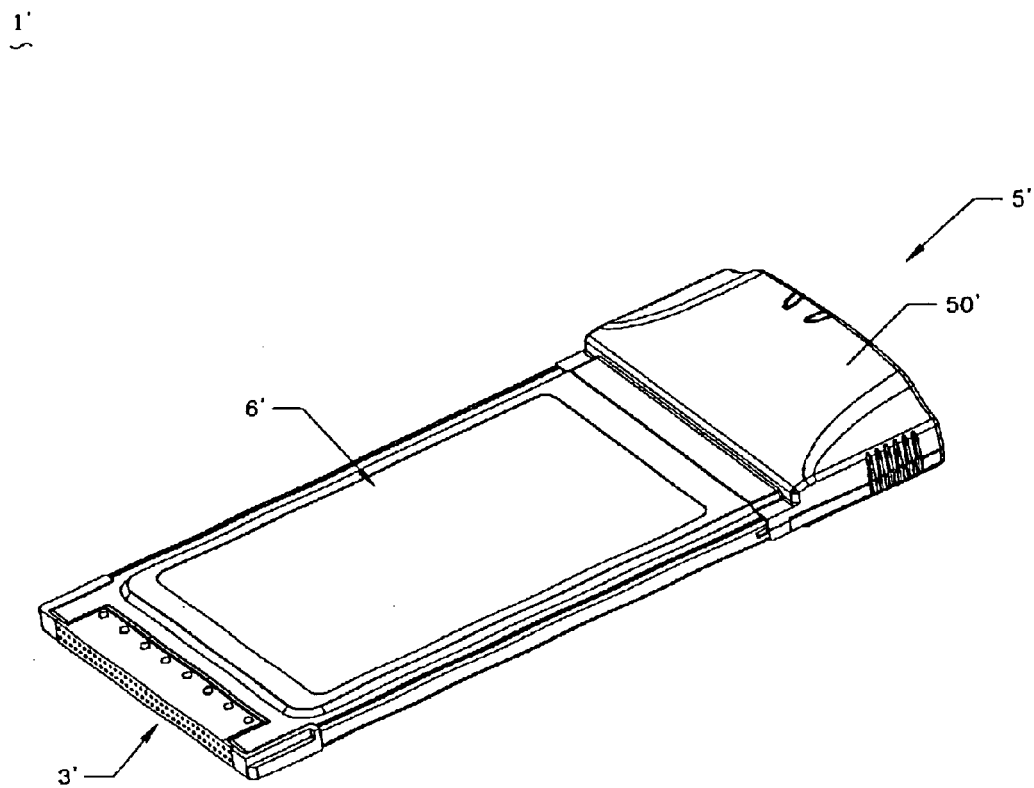
FIG. 13 is an assembled view of FIG. 11.

FIGS. 11 and 12 show an electronic card in accordance with a second embodiment of the present invention. Similar to the one of the first embodiment, the electronic card of the second embodiment comprises an insulative casing 2', a connector 3', a circuit board 4', a receiving portion 5', a first shell 6' and a second shell 7'. The different from the first embodiment is that a first cover 50' extends unitarily and longitudinally from a transverse bar 22', and that a connecting bar 29' connects an end of a first bar 21' and an end of a second bar 22' and opposite to the transverse bar 22'. A lib 291' is provided on the connecting bar 29' for separating the first shell 6' and the second shell 7' from a metallic shielding strip 30' of the connector 3', thereby avoiding the shortcutting between the metallic shielding strip 30' and the first and shells 6', 7'.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An electronic card comprising:
   an insulative casing including a first bar, a second bar and a traverse bar transversely connecting with an end of the first bar and an end of the second bar, assembling passages being respectively defined in opposite ends of the first bar and the second bar and are far from the transverse bar, positioning passages being defined in the first bar and the second bar and opposite to the assembling passages, obstruction passages being defined in the first bar and the second bar and adjacent to the transverse bar, at least a locking hole being defined in the transverse bar, a receiving portion extending in a longitudinal direction of the transverse bar and including a first cover and a second cover;
   a first shell for shielding a surface of the insulative casing, forming tabs for cooperating with the assembling passages of the first bar and the second bar and the locking hole of the transverse bar to receive a card, and mounting walls for embracing outward surfaces of the first bar and the second bar;
   a second shell for shielding a surface of the insulative casing opposite to the first shell, forming latching walls for cooperating with the positioning passages of the first bar and the second bar, enveloping walls for embracing the mounting walls of the first shell, and obstruction walls for abutting against the obstruction passages of the first bar and the second bar;
   a circuit board being assembled to the insulative casing and communicating with the connector; and
   a wireless appliance communicating with the circuit board and being received in the receiving portion of the insulative casing.

2. The electronic card as claimed in claim 1, wherein falling surfaces are respectively formed on outward side of the first bar and the second bar and enclosed by the mounting walls of the first shell.

3. The electronic card as claimed in claim 1, wherein biasing surfaces are provided to abut against enveloping walls of the second shell when the enveloping walls embrace the mounting walls of the first shell.

4. The electronic card as claimed in claim 3, wherein the first cover forms locking posts, and the second cover defines fixing holes for corresponding to the fixing hole thereby retaining the first cover and the second cover.

5. The electronic card as claimed in claim 1, wherein the tabs extend perpendicularly from edges of the first shell, and wherein interference portions extend from opposite side edges of each tab.

6. The electronic card as claimed in claim 1, wherein the latching walls perpendicularly extend from edges of opposite sides of the second shell and have an inverted-cone shape.

7. The electronic card as claimed in claim 1, wherein the cross-sections of the mounting walls of the first shell and the cross-sections of the enveloping walls have an L-shape.

8. An electronic card comprising:

an insulative casing including a first bar, a second bar and a traverse bar transversely connecting with an end of the first bar and an end of the second bar, assembling passages being respectively defined in opposite ends of the first bar and the second bar and are far from the transverse bar, receiving passages being defined respectively in the first bar and the second bar and receiving a connector with a metallic shielding strip, positioning passages being defined in the first bar and the second bar and opposite to the assembling passages, a receiving portion being provided opposite to the assembling passages and including a first cover and a second cover, a connecting bar connecting an end of the first bar and an end of the second bar and opposite to the transverse bar and forming a lip thereon;

a first shell for shielding a surface of the insulative casing, forming tabs for cooperating with the assembling passages of the first bar and the second bar;

a second shell for shielding a surface of the insulative casing opposite to the first shell, forming latching walls for cooperating with the positioning passages of the first bar and the second bar;

a circuit board being assembled to the insulative casing and communicating with the connector; and a wireless appliance communicating with the circuit board and being received in the receiving portion of the insulative casing.

9. The electronic card as claimed in claim 8, wherein the first shell has mounting walls for embracing outward surfaces of the first bar and the second bar, wherein the second shell has enveloping walls for embracing the mounting walls of the first shell, and wherein the cross-sections of the mounting walls of the first shell and the cross-sections of the enveloping walls have an L-shape.

10. The electronic card as claimed in claim 9, wherein falling surfaces are respectively formed on outward side of the first bar and the second bar and enclosed by the mounting walls of the first shell.

11. The electronic card as claimed in claim 9, wherein biasing surfaces are provided to abut against enveloping walls of the second shell when the enveloping walls embrace the mounting walls of the first shell.

12. The electronic card as claimed in claim 8, wherein tabs extend perpendicularly from edges of the first shell, and wherein interference portions extend from opposite side edges of each tab.

13. The electronic card as claimed in claim 8, wherein latching walls perpendicularly extend from edges of opposite sides of the second shell and have an inverted-cone shaped.

14. An electronic card comprising:

an insulative casing including a first bar, a second bar, assembling passages being respectively defined in opposite ends of the first bar and the second bar and the second bar and receiving a connector with a metallic shielding strip, positioning passages being defined in the first bar and the second bar and opposite to the assembling passages, a receiving portion being provided opposite to the assembling passages and including a first cover and a second cover, the first cover being unitarily formed with the insulative casing;

a first shell for shielding a surface of the insulative casing, forming tabs for cooperating with the assembling passages of the first bar and the second bar;

a second shell for shielding a surface of the insulative casing opposite to the first shell, forming latching walls for cooperating with the positioning passages of the first bar and the second bar;

a circuit board being assembled to the insulative casing and communicating with the connector; and a wireless appliance communicating with the circuit board and being received in the receiving portion of the insulative casing.

15. The electronic card as claimed in claim 14, wherein the first cover is arranged on the top of the insulative casing.

16. The electronic card as claimed in claim 14, wherein a transverse bar is provided between the first bar and the second bar and defines a plurality of locking holes for positioning the first shell.

17. The electronic card as claimed in claim 16, wherein obstruction passages are defined in the first bar and the second bar and adjacent to the transverse bar.

18. The electronic card as claimed in claim 14, wherein the first shell has mounting walls for embracing outward surfaces of the first bar and the second bar, wherein the second shell has enveloping walls for embracing the mounting walls of the first shell, and wherein the cross-sections of the mounting walls of the first shell and the cross-sections of the enveloping walls have an L-shape.

19. The electronic card as claimed in claim 18, wherein falling surfaces are respectively formed on outward side of the first bar and the second bar and enclosed by the mounting walls of the first shell.

20. The electronic card as claimed in claim 14, wherein biasing surfaces are provided to abut against enveloping walls of the second shell when the enveloping walls embrace the mounting walls of the first shell.

* * * * *